(12) United States Patent
Rodriguez et al.

(10) Patent No.: US 12,331,515 B2
(45) Date of Patent: Jun. 17, 2025

(54) PANEL SUPPORT AND INSTALLATION SYSTEM

(71) Applicant: Hoffman Enclosures Inc., Anoka, MN (US)

(72) Inventors: Jose Antonio Rodriguez, Madrid (ES); David Ramos, Madrid (ES); Florin Patrunjel, Brasov (RO)

(73) Assignee: Hoffman Enclosures Inc., Anoka, MN (US)

( * ) Notice: Subject to any disclaimer, the term of this patent is extended or adjusted under 35 U.S.C. 154(b) by 286 days.

(21) Appl. No.: 18/296,076

(22) Filed: Apr. 5, 2023

(65) Prior Publication Data

US 2023/0323661 A1 Oct. 12, 2023

Related U.S. Application Data

(60) Provisional application No. 63/327,909, filed on Apr. 6, 2022.

(51) Int. Cl.
*E04B 2/74* (2006.01)
(52) U.S. Cl.
CPC .... *E04B 2/7448* (2013.01); *E04B 2002/7483* (2013.01)
(58) Field of Classification Search
CPC .......... H02B 1/301; H02B 1/013; H02B 1/32; A47B 55/00; A47B 47/00; A47B 47/0091; E04B 2/7448; E04B 2002/7483
USPC .......................................................... 52/64
See application file for complete search history.

(56) References Cited

U.S. PATENT DOCUMENTS

| | | | |
|---|---|---|---|
| 5,292,189 A | 3/1994 | Lau et al. | |
| 5,380,083 A * | 1/1995 | Jones | H02B 1/38 |
| | | | 312/265.6 |
| 5,447,002 A * | 9/1995 | Wehrmann | E04B 2/7422 |
| | | | 52/282.4 |
| 6,145,943 A | 11/2000 | Reuter et al. | |
| 6,155,660 A * | 12/2000 | Nicolai | H02B 1/30 |
| | | | 312/223.1 |
| 7,388,963 B2 | 6/2008 | Han et al. | |
| 7,784,889 B2 | 8/2010 | Benner et al. | |
| 7,918,528 B2 | 4/2011 | Govyadinov et al. | |
| 8,177,318 B2 | 5/2012 | Govyadinov et al. | |
| 8,231,199 B2 | 7/2012 | Hendricks et al. | |
| 8,371,666 B2 | 2/2013 | Wu | |

(Continued)

FOREIGN PATENT DOCUMENTS

| | | |
|---|---|---|
| WO | 96/24236 A1 | 8/1996 |
| WO | 96/30978 A1 | 10/1996 |
| WO | 2017/061958 A1 | 4/2017 |

*Primary Examiner* — Paola Agudelo
(74) *Attorney, Agent, or Firm* — Quarles & Brady L.P.

(57) ABSTRACT

A panel support system for mounting a panel to an enclosure can include support profiles mounted to a top and a bottom of the enclosure. The support profiles can define elongate channels that can be sized to receive a top or bottom portion of the panel. The bottom support profile can have apertures along a base wall of the profile. Elements for reducing friction, including, for example, rollers can extend through the apertures in an installation configuration, to facilitate insertion of a panel into the elongate channel. The friction-reducing elements can be moved to an installed configuration once the panel is in place, allowing the panel to rest on the base wall of the bottom support profile.

20 Claims, 8 Drawing Sheets

(56) References Cited

U.S. PATENT DOCUMENTS

| | | |
|---|---|---|
| 8,376,506 B2 | 2/2013 | Shepherd et al. |
| 8,419,159 B2 | 4/2013 | Govyadinov et al. |
| 8,449,068 B2 | 5/2013 | Govyadinov |
| 8,529,011 B2 | 9/2013 | Govyadinov |
| 8,607,996 B2 | 12/2013 | Yang |
| 8,665,582 B2 | 3/2014 | Robinson et al. |
| 9,241,453 B1 | 1/2016 | Martin et al. |
| 9,374,953 B2 | 6/2016 | Martin et al. |
| 9,788,495 B2 | 10/2017 | Martin et al. |
| 10,811,854 B2 * | 10/2020 | Boehme ............. H02B 1/013 |
| 11,089,873 B1 | 8/2021 | Dawson et al. |
| 11,283,246 B2 * | 3/2022 | Boehme ............. H02B 1/042 |
| 11,464,180 B2 | 10/2022 | Martin et al. |
| 2008/0079338 A1 * | 4/2008 | Van Dyke ............ A47B 53/02 |
| | | 312/201 |
| 2011/0271630 A1 * | 11/2011 | Kadzban ............ E04B 2/7427 |
| | | 52/582.1 |
| 2016/0270527 A1 * | 9/2016 | Winter ............... B62B 3/004 |
| 2017/0127555 A1 * | 5/2017 | Anderson ............ H02B 1/012 |
| 2017/0191260 A1 | 7/2017 | Lee |
| 2018/0055219 A1 * | 3/2018 | Lim ................ A47B 47/0091 |
| 2019/0327849 A1 * | 10/2019 | Ding ............... A47B 47/0091 |
| 2020/0408028 A1 * | 12/2020 | Schmider ............ A47B 87/008 |
| 2021/0143615 A1 * | 5/2021 | Boehme ............. H02B 1/042 |
| 2021/0362310 A1 | 11/2021 | Perez et al. |
| 2022/0295985 A1 | 9/2022 | Mendelson et al. |

\* cited by examiner

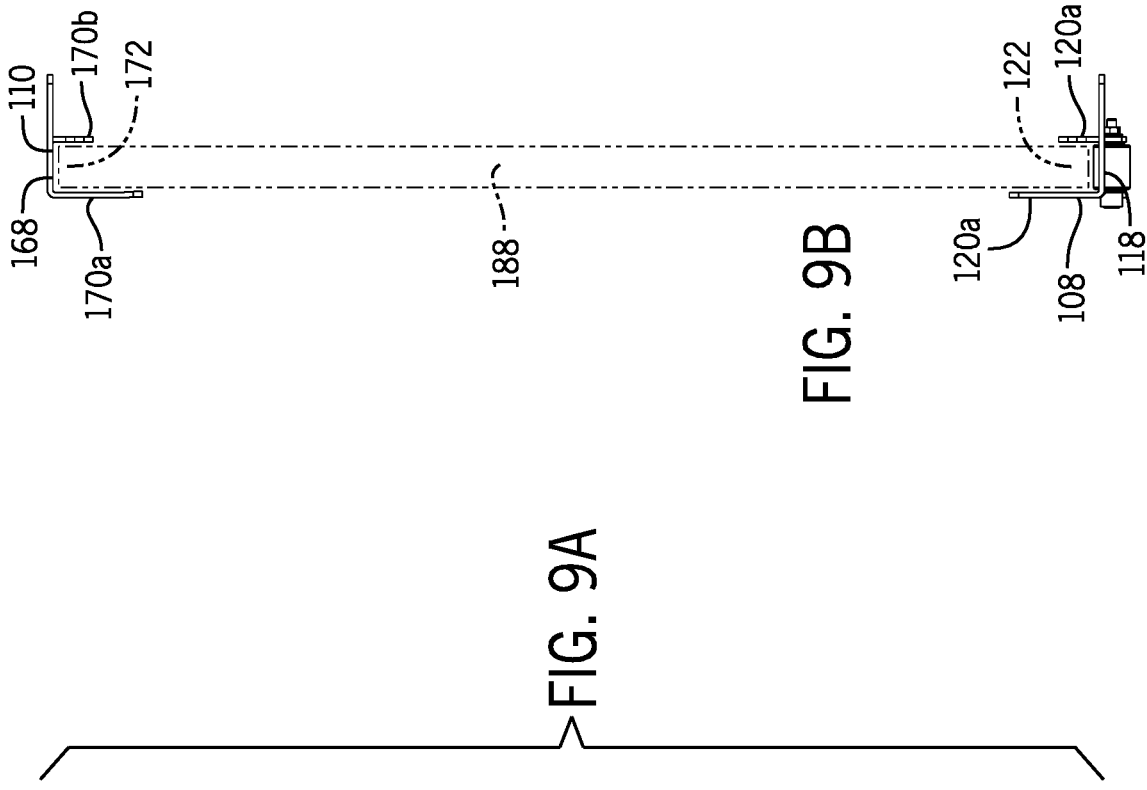
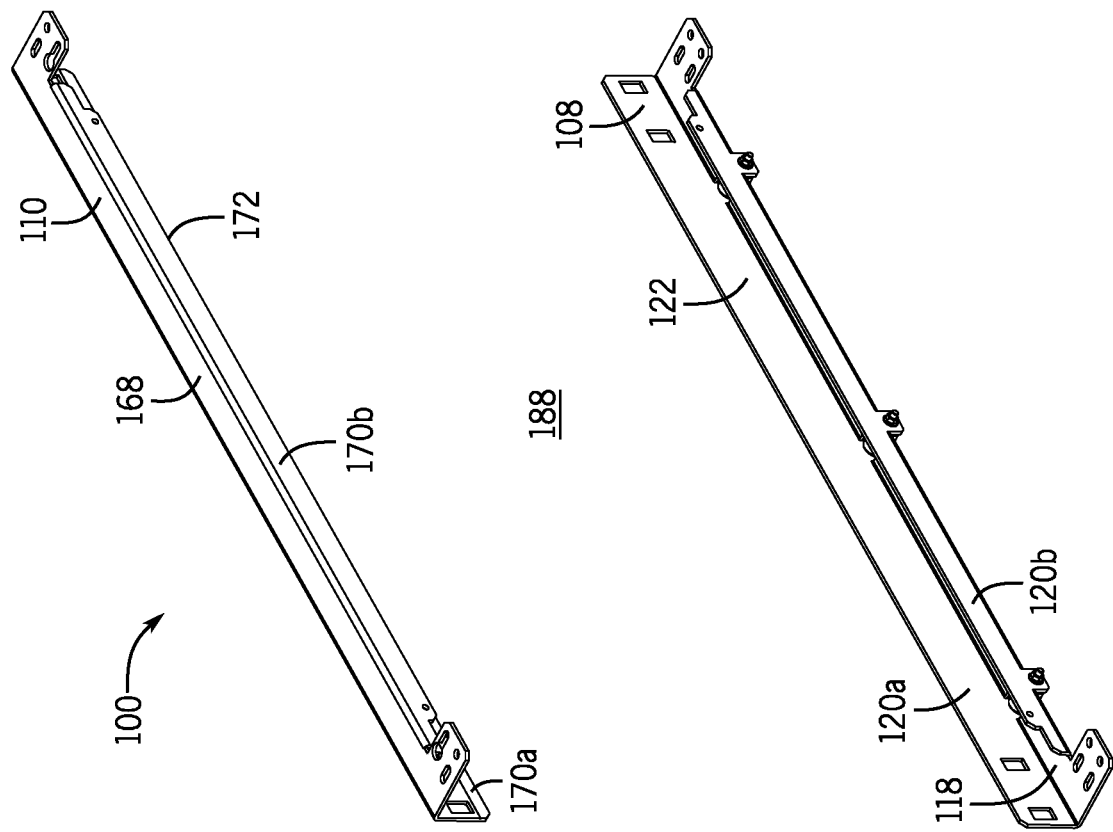

PANEL SUPPORT AND INSTALLATION SYSTEM

CROSS-REFERENCE TO RELATED APPLICATIONS

This application claims priority to U.S. Provisional Application No. 63/327,909, filed Apr. 6, 2022, the entirety of which is incorporated herein by reference.

BACKGROUND

Electrical enclosures may include mounting panels for mounting electrical components, and the mounting panels can be secured to an enclosure. In some contexts, it may be useful for an electrical enclosure to include components for securing a mounting plate thereto.

SUMMARY

Embodiments of the invention can provide improved panel support systems for mounting a panel to an enclosure.

Some embodiments of the invention can provide a panel support system for mounting a panel to an enclosure. The panel support system can include an enclosure frame comprising a top frame member and a bottom frame member and a support profile mounted to the bottom frame member to receive a panel in an insertion direction. The support profile can include a base wall that includes apertures along the insertion direction. The support profile can include cylinders secured to channel structure in alignment with the apertures, with the cylinders movable relative to the base wall between an installation configuration and an installed configuration. In the installation configuration, the cylinders can extend through the apertures to protrude a first height above the base wall, to rollingly support the panel for installation along the support profile. In the installed configuration, the cylinders can protrude above the base wall by less than the first height, to align the panel for support on the base wall.

In some examples, the cylinders do not protrude above the base wall in the installed configuration. In some examples, the panel support system can further include downwardly depending tabs that extend from opposing lateral sides of the support profile to adjustably support the cylinders below the base wall. In some examples, the downwardly depending tabs can include slots that support the cylinders for sliding movement between the installation and installed configurations. In some examples, the support profile can include lateral sidewalls that define an open channel profile to receive the panel. In some examples, relative to movement of the panel, the material of the cylinders can be configured to provide a lower coefficient of friction than the material of the base wall. In some examples, the panel support system can further include a second support profile mounted to the top frame member, wherein the support profile and the second support profile collectively provide a mounting channel structure that is sized to receive the panel.

Some embodiments of the invention can provide a panel support system to support a panel of an enclosure during and after installation of the panel. The panel support system can include a panel support profile. The panel support profile can include a base wall extending along an elongate direction of the panel support profile. A first mounting structure can define mounting slots at opposing lateral sides of the base wall. A first friction-reducing element can be adjustably secured to the first mounting structure at the mounting slots. The first friction-reducing element can be movable between an installation configuration, in which the first friction-reducing element protrudes above the base wall, and an installed configuration in which the first friction-reducing element does not protrude above the base wall.

In some examples, the panel support profile includes opposing lateral sidewalls disposed adjacent to the base wall to define an elongate U-shaped channel to receive the panel; and, in the installation configuration, the first friction-reducing element can extend into the elongate channel. In some examples, the first friction-reducing element can be a roller configured to rotate along an axis that extends between the mounting slots. In some examples, the base wall can define a first base aperture, and the first friction-reducing element can be sized to be received into the first base aperture to move between the installed and installation configurations. In some examples, the panel support system of can further include a second friction-reducing element adjustably mounted to a second mounting structure along the panel support profile, the second friction-reducing element being spaced apart from the first friction-reducing element along the elongate direction of the base wall and being movable relative to the base wall between a second installation configuration and a second installed configuration. In some examples, the panel support system can further include a first shaft that extends through the mounting slots and the first friction-reducing element, and a mounting nut arranged to secure the first shaft relative to the panel support profile to secure the first friction-reducing element in the installation configuration. In some examples, the panel support system can further include a bracket that non-rotatably secures the first shaft to the panel support profile. In some examples, the panel support profile can be secured to an enclosure frame. In some examples, the panel support profile can be positioned opposite a second panel support profile secured to the enclosure frame, and the panel support profile and the second panel support profile can collectively define a mounting channel sized to receive a panel within the enclosure frame. In some examples, the first mounting structure can include tabs that extend from the panel support profile in a direction transverse to the base wall, and mounting slots can be defined in the tabs.

Some embodiments of the invention can include a method of installing a panel into an enclosure frame that includes a top frame member and a bottom frame member. The method can include moving a panel along a support profile in an insertion direction, with the panel supported on friction-reducing elements of the support profile. The support profile can be mounted to the bottom frame member and can include a base wall that includes apertures along the insertion direction. The panel can be supported for movement in the insertion direction with the friction-reducing elements in an installation configuration, in which the friction-reducing elements extend a first height above the base wall. After moving the panel in the insertion direction, the friction-reducing elements can be moved to a second height above the base wall that is less than the first height, so that the panel is supported on the base wall.

In some examples, before moving the panel in the insertion direction along the support profile, the friction-reducing elements can be secured in the installation configuration. In some examples, the friction-reducing elements are cylinders that are rotatable about axes that are transverse to the insertion direction.

In some implementations, devices or systems disclosed herein can be utilized, manufactured, installed, etc. using methods embodying aspects of the invention. Correspondingly, any description herein of particular features, capabilities, or intended purposes of a device or system is generally intended to include disclosure of a method of using such devices for the intended purposes, of a method of otherwise implementing such capabilities, of a method of manufacturing relevant components of such a device or system (or the device or system as a whole), and of a method of installing disclosed (or otherwise known) components to support such purposes or capabilities. Similarly, unless otherwise indicated or limited, discussion herein of any method of manufacturing or using for a particular device or system, including installing the device or system, is intended to inherently include disclosure, as embodiments of the invention, of the utilized features and implemented capabilities of such device or system.

BRIEF DESCRIPTION OF THE DRAWINGS

The accompanying drawings, which are incorporated in and form a part of this specification, illustrate embodiments of the invention and, together with the description, serve to explain the principles of embodiments of the invention:

FIG. 9A is a front top right isometric view of a mounting channel structure defined by the first and second panel support profiles, as shown in FIG. 1;

FIG. 9B is a front elevation view of the mounting channel structure shown in FIG. 9A.

DETAILED DESCRIPTION

Figure 1:
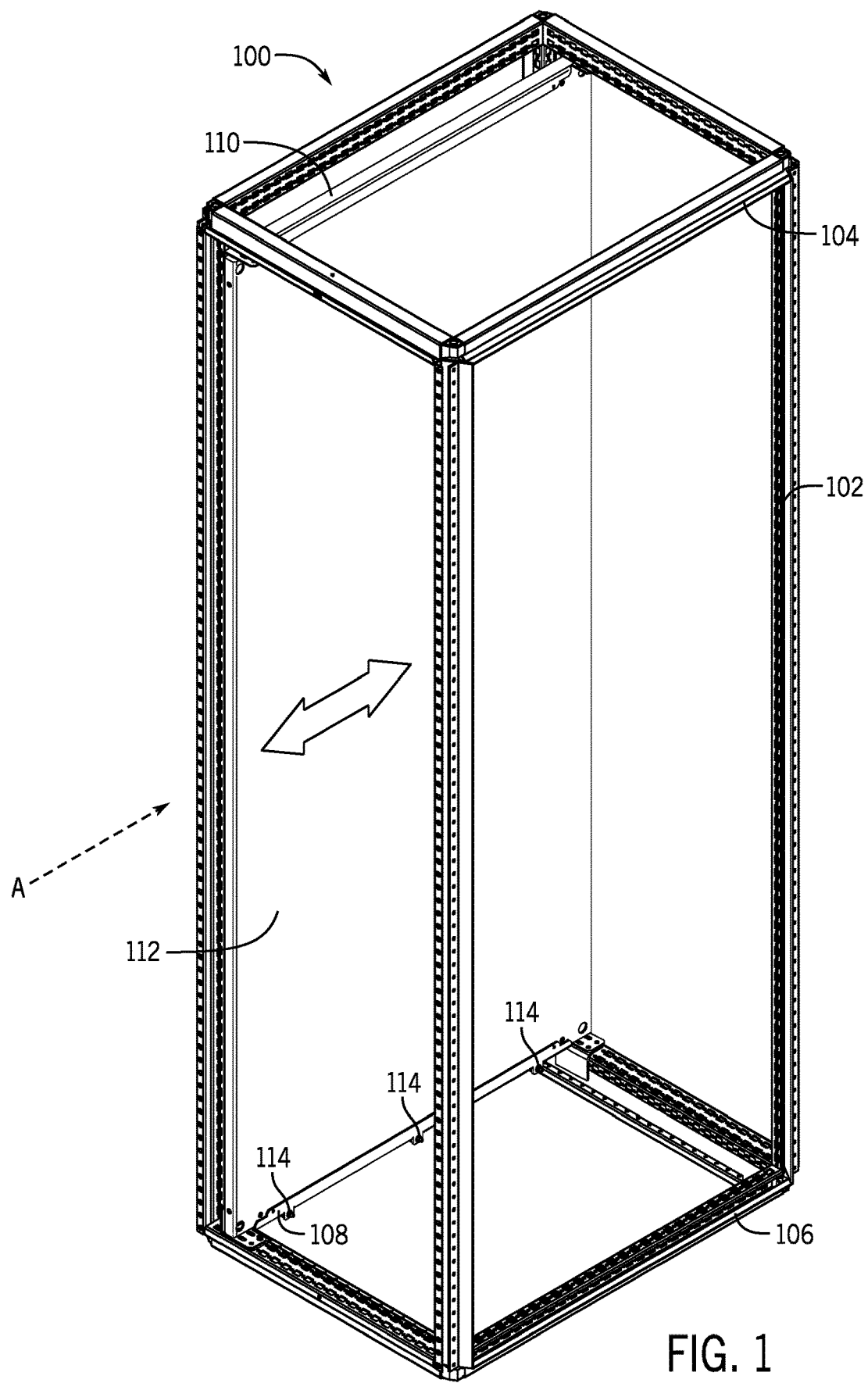
FIG. 1 is a front top right isometric view of a panel support system according to an embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

Also as used herein, unless otherwise limited or defined, "or" indicates a non-exclusive list of components or operations that can be present in any variety of combinations, rather than an exclusive list of components that can be present only as alternatives to each other. For example, a list of "A, B, or C" indicates options of: A; B; C; A and B; A and C; B and C; and A, B, and C. Correspondingly, the term "or" as used herein is intended to indicate exclusive alternatives only when preceded by terms of exclusivity, such as "either," "one of," "only one of," or "exactly one of." For example, a list of "one of A, B, or C" indicates options of: A, but not B and C; B, but not A and C; and C, but not A and B. A list preceded by "one or more" (and variations thereon) and including "or" to separate listed elements indicates options of one or more of any or all of the listed elements. For example, the phrases "one or more of A, B, or C" and "at least one of A, B, or C" indicate options of: one or more A; one or more B; one or more C; one or more A and one or more B; one or more B and one or more C; one or more A and one or more C; and one or more of A, one or more of B, and one or more of C. Similarly, a list preceded by "a plurality of" (and variations thereon) and including "or" to separate listed elements indicates options of multiple instances of any or all of the listed elements. For example, the phrases "a plurality of A, B, or C" and "two or more of A, B, or C" indicate options of: A and B; B and C; A and C; and A, B, and C.

Also as used herein, unless otherwise limited or defined, the terms "about," "substantially," and "approximately" refer to a range of values±5% of the numeric value that the term precedes. As a default the terms "about" and "approximately" are inclusive to the endpoints of the relevant range, but disclosure of ranges exclusive to the endpoints is also intended.

Also as used herein, unless otherwise limited or defined, "integral" and derivatives thereof (e.g., "integrally") describe elements that are manufacture as a single piece without fasteners, adhesive, or the like to secure separate components together. For example, an element stamped as a single-piece component from a single piece of sheet metal, without rivets, screws, or adhesive to hold separately formed pieces together is an integral (and integrally formed) element. In contrast, an element formed from multiple pieces that are separately formed initially then later connected together, is not an integral (or integrally formed) element.

Also as used herein, unless otherwise defined or limited, the term "lateral" refers to a direction that does not extend in parallel with a reference direction. A feature that extends in a lateral direction relative to a reference direction thus extends in a direction, at least a component of which is not parallel to the reference direction. In some cases, a lateral direction can be a radial or other perpendicular direction relative to a reference direction.

As used herein, unless otherwise specified or limited, the term "U-shaped" specifies a shape that includes a base portion, with at least two leg portions extending in similar directions from the base portion. In some embodiments, a "U-shaped" member can include leg portions extending from opposite ends of the base portion at substantially right angles to the base portion (i.e., deviating from right angles by less than 5 degrees), with or without curved, chamfered, or otherwise non-square connecting regions between the leg portions and the base portion. In some embodiments, a "U-shaped" member can include leg portions that extend as part of a continuous (e.g., non-angled) curve from either end of a straight or curved base portion. Thus, for example, some "U-shaped" members may have half-rectangular, semi-circular, or other similar cross-sectional profiles." Further, some "U-shaped" members may include a first leg that is longer than a second leg. In some cases, a base portion of a U-shape can extend over a circular or angled segment.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

As noted above, electrical enclosures can include an enclosure frame, and panels can be mounted to the enclosure frame. The panel may provide a surface on which additional electrical components can be mounted within the enclosure. Support elements can be fixed to the enclosure frame to facilitate mounting of the panel to the enclosure.

Conventional electrical enclosures can provide systems for mounting a panel to an enclosure. In some conventional systems, rail members can be fixed to an enclosure frame on a bottom portion of the frame and a top portion of a frame. The rail members can provide a channel structure into which a panel may be inserted by aligning the panel with the channel structure and moving the panel along the channel structure to the desired position. In conventional systems, then, a bottom surface of the channel engages the bottom rail, and friction therebetween may increase the difficulty of moving a panel to the desired position. In some cases, the difficulty in overcoming the friction between a panel and a rail may increase labor costs associated with installation by requiring multiple workers for the installation of a panel.

According to some embodiments disclosed herein, improved panel support systems can be provided for mounting a panel to an enclosure. For example, a panel support system can include a first panel support profile (e.g., a rail) fixed to a bottom member of an enclosure frame, and a second panel support profile fixed to a top member of an enclosure frame. Each support profile can define a respective channel having a U-shaped (or other respective) profile. Open ends of the respective channels may open toward the other channel to define a mounting channel structure for receiving a panel. Further, the first support profile may include elements for reducing friction between the panel and the support profile during installation. In some embodiments, a panel support profile can include an elongate channel structure partially defining a channel along an elongate direction (e.g., an insertion direction) of the elongate channel structure. In some embodiments, the elongate channel structure can include a base wall that defines a vertical limit of the mounting channel structure. For example, a first elongate channel structure can include a first base wall that defines a bottom end of the mounting channel structure, and a second elongate channel structure can include second base wall positioned opposite the first base wall, the second base wall defining a top of the mounting channel structure. In some embodiments, an elongate channel structure includes one or more side walls that partially define lateral sides of the mounting channel structure.

In some embodiments, panel support profiles (e.g., elongate channel structures, including rails, and the like) can include features or additional elements for reducing friction between a panel and the support profile during insertion of the panel. For example, friction-reducing elements can be arranged to selectively extend into a channel of a panel support profile, and a panel can thus engage the friction-reducing elements during insertion to be supported thereby. In some embodiments, the friction-reducing elements can include a support surface that protrudes above the base wall during insertion of the panel, so that the panel does not engage the base wall during insertion. In some embodiments, the friction-reducing elements can include cylinders that at least partially protrude above the base wall during installation (e.g., insertion) of the panel. In some embodiments, a coefficient of friction between the support surface of the friction-reducing elements and the panel can be lower that a coefficient of friction between the panel and the base wall of the panel support profile. In some embodiments, rollers may be provided on a base wall of the first panel support profile, and a panel can engage the rollers when moving along the support profile. For example, the rollers can extend through openings in a base wall of a support profile to rollingly support a panel during installation. This can significantly reduce a friction between the support profile and the panel, and thus reduce the force require to install the panel. In some embodiments, a friction-reducing element can include any solid structure that can be mounted to a panel support profile and can at least partially protrude above the base wall during installation. For example, a friction-reducing element can include any shape that can at least partially protrude above a base wall during installation including, for example, a sphere, a cube, or a cylinder of any cross-sectional profile (e.g., circular, rectangular, square, oval-shaped, triangular, cam-shaped, etc.).

In some embodiments, friction-reducing elements, like the aforementioned rollers, for example, can be selectively moved between an installation configuration, in which the friction-reducing elements extend into the channel of the support profile, and an installed configuration, in which the friction-reducing elements do not extend (or extend by a smaller distance) into the channel of the support profile. For example, a fastener can be loosened to move rollers or other friction-reducing elements (e.g., slides) between installation and installed configurations, then tightened to selectively (and temporarily, as applicable) secure the rollers/elements in one or more of the configurations. For example, in the installation configuration friction-reducing elements can be secured to protrude a particular height above a base wall of a support profile, so that the elements can rollingly (or slidably) support a panel as the panel is translated along the support profile. Once the panel has been aligned in an installed (e.g., service) orientation, the friction-reducing elements can then be moved (e.g., released, to move by gravity) to the installed configuration, to align (e.g., lower)

the panel to be more fully supported on the base wall. In this regard, in the installed configuration, friction-reducing elements can generally protrude by a smaller height above the base wall than in the installation configuration (e.g., to a zero height or to negative height, i.e., to below the base wall).

Thus, for example, a user can easily secure rollers (or other friction-reducing elements) in an installation configuration before loading the panel into an enclosure, to support easier installation of a panel. The user can then can easily move the rollers (or other friction-reducing elements) from the installation configuration to an installed configuration (e.g., by loosening and then re-tightening a supporting connection for a roller) to allow the panel to seat on the relevant support profile.

In some embodiments, the second support profile can include features to facilitate fixing the support profile to the enclosure frame. For example, the second support profile can define keyhole openings on opposing sides of the second support profile. A circular portion of the keyhole opening having a first diameter may receive a head of a screw protruding from the top frame member of the enclosure. The second support profile may then be moved relative to the screw, so that a shaft of the screw is received into a slot portion of the keyhole opening, the slot portion having a width that is less than the first diameter of the circular portion, and also less than the diameter of the head of the screw. A surface of the second support profile on a periphery of the slot portion may thus engage with the screw head to secure the second support profile to the top frame member.

In this regard, FIG. 1 illustrates an example panel support system 100, according to some embodiments. In the illustrated example, the panel support system includes an enclosure frame 102 having a top frame portion 104 and a bottom frame portion 106. As shown, both the top and bottom frame portions 104, 106 are comprised of four frame members arranged in a rectangle, joined together by elongate vertical frame members. In other embodiments, other frame configurations and other frame members are possible.

FIG. 1 further illustrates a first support profile 108 mounted to the bottom frame portion 106, and a second support profile 110 mounted to the top frame portion 104. In the illustrated embodiment, opposing ends of the respective support profiles 108, 110 are mounted to opposing front and rear frame members of the respective frame portions 104, 106. However, in other embodiments support profiles can be mounted to frame members in other configurations. For example, support profiles can be mounted to a single frame member or to other frame members than are shown, support profiles can be integrally formed with a frame, or support profiles can be mounted to a surface of a frame that comprises a plate.

Support profiles of a panel support system can provide a guide for installing a panel to an enclosure frame and serve to secure and support the panel once installed. For example, FIG. 1 further illustrates a panel 112 secured to the enclosure frame 102. As illustrated, the panel 112 can be seated on the first support profile 108, and the second support profile 110 can retain a top portion of the panel 112. As mentioned above, the panel can be installed by moving the panel along the support profiles in an insertion direction. Thus, for the panel 112 to reach the installed position, as shown in FIG. 1, it must be moved or translated along the support profiles 108, 110 in an insertion direction A.

As noted above, in conventional systems, this movement of the panel 112 may encounter substantial frictional resistance, due in part to an engagement of a bottom surface of the panel to a surface of a supporting rail. In contrast, in the illustrated embodiment, the first support profile 108 includes rollers 114 to reduce a friction between the bottom surface of the panel 112 and the first support profile 108 as the panel 112 moves along the first support profile 108 during installation. The rollers 114 therefore reduce the force required to install a panel, which can have the effect of reducing labor costs for the installation of a panel, as discussed above. Other embodiments are possible, however, and a first support profile can include elements for reducing friction that do not require rotational movement, including as is discussed further below.

Figure 2:
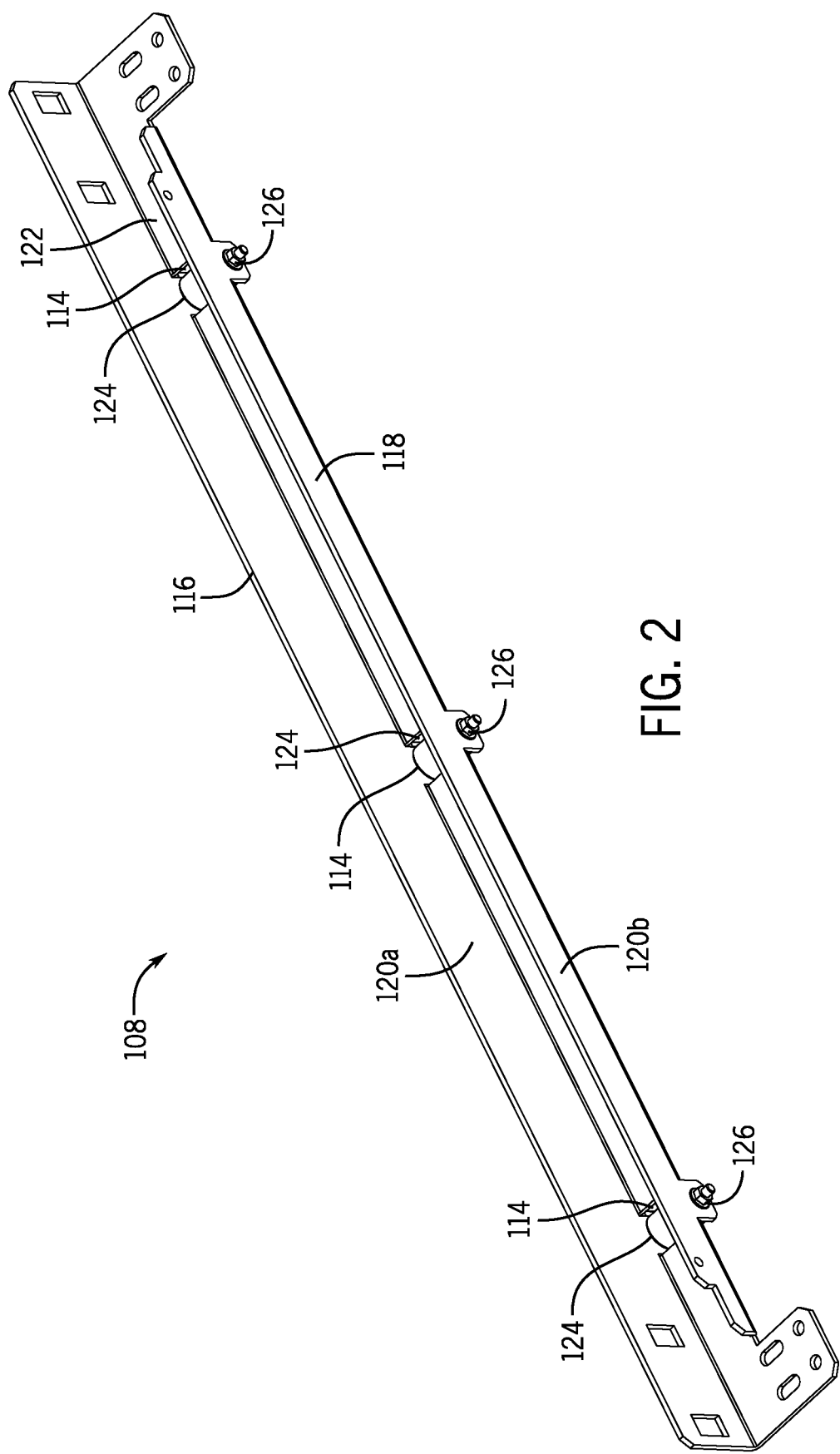
FIG. 2 is a front top right isometric view of a first panel-support profile of the panel support system of FIG. 1.

A first panel support profile can be of a shape and configuration to guide a panel in an insertion direction and secure the panel to the enclosure frame by preventing translational movement of the panel in a lateral direction perpendicular to the insertion direction. Thus, according to some embodiments, as shown in FIG. 2, a first panel support profile 108 can include an elongate channel structure 116 which can have a base wall 118, and opposing sidewalls 120a, 120b (e.g., to form a rail with a channel, in the example shown). The opposing sidewalls 120a, 120b can each be adjacent to and extend perpendicularly from the base wall 118 and can be parallel with the other opposing sidewall 120a, 120b. The opposing sidewalls 120a, 120b and the base wall 118 can each have a length in an elongate direction that is parallel to the insertion direction A of the panel. Further, as shown, the length of one of the sidewalls 120a, 120b may differ from the length of the other sidewall 120a, 120b or from the length of the base wall 118. In other embodiments, however, opposing sidewalls of a rail or other channel structure of a support profile can have a length that is equal to a length of a base wall of the rail or other channel structure. In the illustrated embodiment, the sidewalls 120a, 120b are integrally formed with the base wall 118, which may, for example, reduce material costs or assembly costs of the first support profile 108. However, in other embodiments, sidewalls of a support profile may be separate components from a base wall and may require attachment thereto.

As further illustrated in FIG. 2, the sidewalls 120a, 120b and the base wall 118 of the elongate structure 116 may define an elongate channel 122. The elongate channel 122 as illustrated has an open side disposed opposite the base wall 118. A cross-sectional profile of the elongate channel 122 can be shaped and configured to receive a bottom edge of the panel 112 (e.g., the sidewalls 120a, 120b, and the base wall 118 can define a U-shaped channel, a C-shaped channel, a J-shaped channel, etc.). As an example, a cross-sectional profile of the elongate channel 122 is generally rectangular, but an elongate channel can have a cross-sectional profile of any shape that is suitable for receiving a bottom edge of a panel.

As mentioned above, the weight of a panel can cause friction between a base wall of a support profile and a bottom edge of the panel, which can increase the difficulty of moving the panel along the support profile, as discussed above. Therefore, it can be advantageous for a bottom support profile (e.g., the first support profile 108) to include friction-reducing elements to ease installation of a panel into an enclosure. In this regard, then, FIG. 2 illustrates a plurality of base apertures 124 defined in the base wall 118. In the embodiment illustrated in FIG. 2, the base wall 118 defines three base apertures 124, with each of the plurality of base apertures 124 spaced apart from a next base aperture 124 by a uniform interval. However, in other embodiments, a base wall could include only two base apertures, or only one base aperture, or more than three base apertures, or can be spaced in other patterns. Further, the number of base apertures could vary with a length of a base wall, and could, for example, be determined by dividing the length of the base wall by a predetermined uniform interval to determine an optimal number of apertures for the base wall. As further detailed below, providing one or more base apertures can thus cooperate with one or more friction-reducing elements that are mounted to a rail of a support profile, which can help to further reduce a friction between a panel and a support profile by ensuring a bottom portion of the panel remains elevated from a base wall of the support profile and in contact with friction-reducing elements along a whole length of the support profile.

As further illustrated in FIG. 2, each of the plurality of apertures 124 can be sized and configured to at least partially receive a corresponding friction-reducing element. In the illustrated embodiment, the friction-reducing elements are rollers 114. The rollers 114 shown in FIG. 2 are mounted to the elongate channel structure 116, each of the rollers 114 being aligned with a corresponding one of the plurality of base apertures 124. As shown, a support surface of each of the rollers 114 extends into the elongate channel 122. When a support surface of each of the rollers 114 extends sufficiently through a corresponding base aperture 124 into the elongate channel 122, a panel 112 (not shown) moving along the first support profile 108 engages the support surface of the rollers 114 and causes rotational movement of the rollers 114, thus reducing the friction generated in installation of the panel 112.

As also discussed above, friction-reducing elements need not be rollers, and can include any components that can reduce friction for translational, supported installation of a panel, as compared to frictional engagement between a base wall of a bottom support profile and a panel. For example, the friction-reducing elements could comprise rotationally fixed elements (e.g., cylinders, blocks, pads, etc.) each having a support surface that can extend into a channel (e.g., be selectively extendable into the channel), wherein a coefficient of friction between the support surface of the rotationally fixed friction-reducing elements and a panel is less than a coefficient of friction between the base wall of the support profile and the panel. For example, cylinders for rolling or sliding support can be formed from various known materials that provide relatively low coefficients of friction (e.g., various plastics or other polymers, or any number of supporting materials with a low-friction coating or surface treatment). Other embodiments are possible, however, and friction-reducing elements can comprise any components that can reduce a friction between a panel and a support profile during installation of the panel.

A support profile for securing a panel to an enclosure frame can have mounting structures for mounting and supporting friction-reducing elements (e.g., rollers). As further illustrated in FIG. 2, the elongate channel structure 116 of the first support profile 108 can include a plurality of downwardly depending mounting tabs 126. The mounting tabs 126 may be positioned adjacent to corresponding base apertures 124 and may depend downwardly from and be substantially coplanar with a corresponding one of the sidewalls 120a, 120b. Thus, each of the plurality of base apertures 124 may be adjacent to two mounting tabs 126 that oppose each other, and depend downwardly from respective sidewalls 120a, 120b on opposing lateral sides of the corresponding aperture 124. In FIG. 2, only the mounting tabs depending from sidewall 120b are shown, however, mounting tabs 126 also depend downwardly from sidewall 120a, as shown, for example, in FIG. 3B. The mounting tabs 126 can be integrally formed with the elongate channel structure 116, which can reduce material costs and provide manufacturing efficiencies.

Figure 3A:
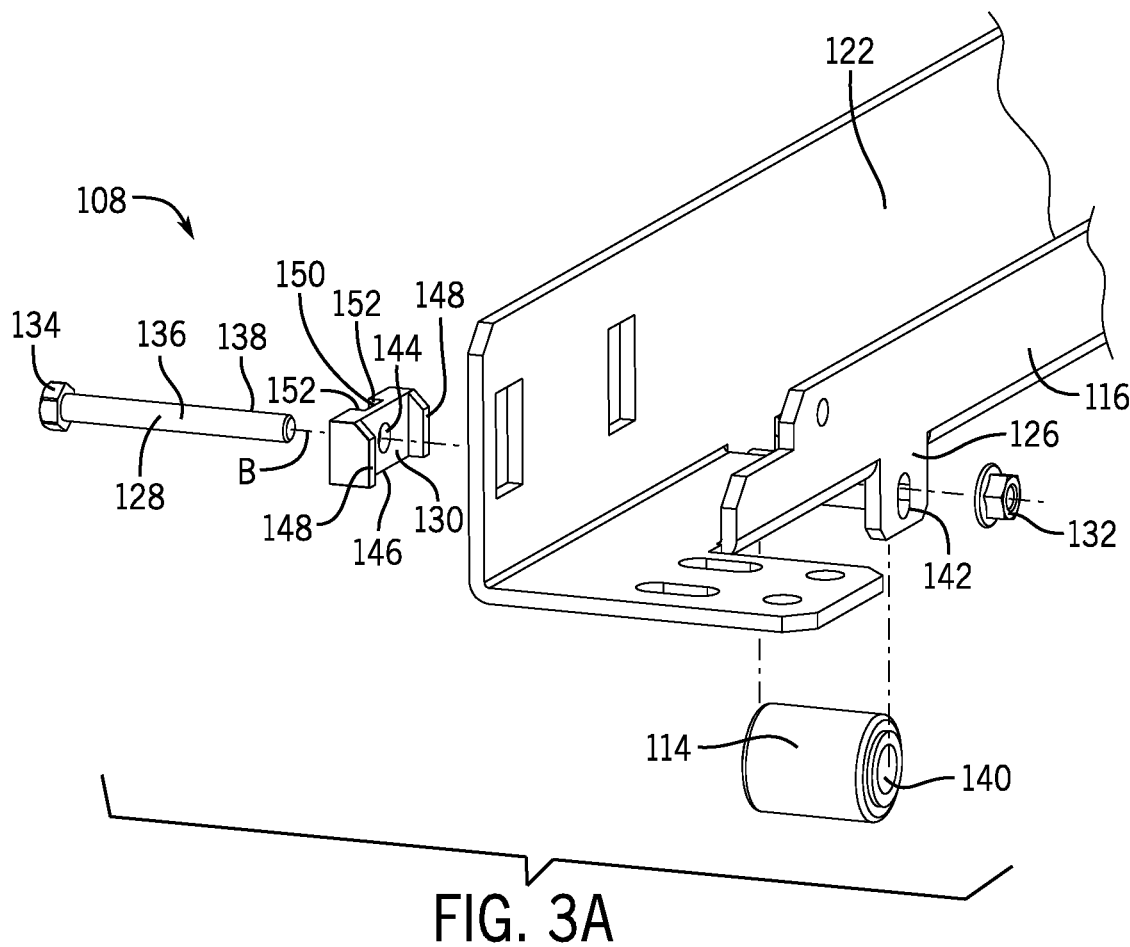
FIG. 3A is an exploded view of a mounting assembly for mounting a roller to a first support profile, as shown in FIG. 1.

In some embodiments, mounting assemblies can be provided for mounting friction-reducing elements to a bottom support profile with a movable mounting. For example, mounting tabs or other portions of a bottom support profile can have features to allow the friction-reducing elements to move (e.g., be selectively moved by an operator) between different configurations. Generally, a variety of mounting arrangements can be used in this regard, including arrangements with slots or other structures to define and guide a prescribed range of movement of a particular element. In this regard, FIG. 3A illustrates components of an example mounting assembly for mounting a roller (or other friction-reducing element), which can include a fastener bolt 128, a bracket 130, a mounting nut 132, and a roller 114. The bolt 128 can have a head 134, a shaft 136 having a shaft diameter, and a threaded portion 138 on a distal end of the bolt 128. The head 134 of the bolt can be a hex head, providing six engagement surfaces that are orthogonal to a longitudinal axis of the bolt 128. In other embodiments, however, a bolt head can have other configurations, including, for example, a rounded head, a cylindrical socket cap, a domed head, etc. The mounting nut 132 can also have a hexagonal shape and can be sized to receive the threaded portion 138 of the bolt 128. Other embodiments may include different mechanisms for securing a mounting assembly for friction-reducing elements. For example, a clamping mechanism may be provided to be secured to the threaded portion, and the assembly may be secured or loosened by moving the clamp to a clamping position or a releasing position respectively. Other embodiments are possible.

Continuing, the roller 114 can define a cylindrical channel 140 therein, with a diameter that is at least the size of the shaft diameter of the bolt. Further, as shown in FIG. 3A, the mounting tabs 126 can each define a mounting slot 142 (only one visible in FIG. 3A), the mounting slot 142 having a width that is at least equal to the shaft diameter of the shaft 136. A rotational axis B can extend through the mounting slots 142 of opposing mounting tabs 126, and can be transverse to an elongate direction of the first elongate channel 122 (e.g., the insertion direction A, shown in FIG. 1).

Figure 3B:
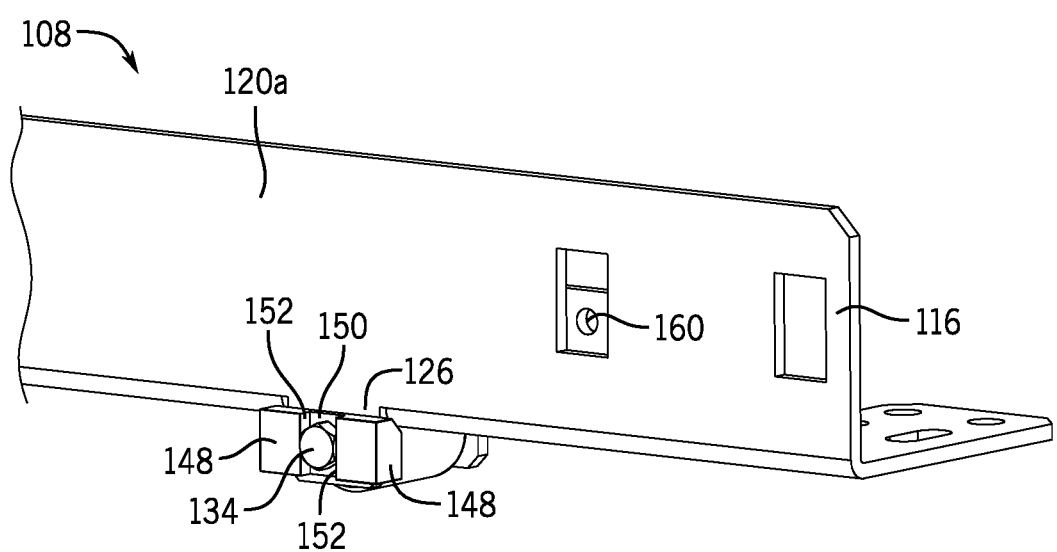
FIG. 3B is a front top left isometric partial view of the first support profile, showing a roller mounted to the first support profile.

The bracket 130 can include an aperture 144 having a diameter that is at least as large as the shaft diameter. The bracket 130, as illustrated, can further have a body 146, and opposing lateral portions 148 that extend outwardly from the body 146 and are spaced apart from each other by a distance that is at least equal to a width of a mounting tab 126. The bracket 130 can further define a rectangular indent 150 on a side of the bracket that is opposite the direction in which the lateral portions 148 extend. The rectangular indent 150 can have opposing walls 152 that are parallel to each other and spaced apart by a distance that is at least equal to a distance between two parallel engagement surfaces of the hexagonal head 134 (e.g., as shown in FIG. 3B).

To mount the roller 114 to the elongate channel structure 116, the roller 114 can be positioned so that the rotational axis B extends through the cylindrical channel 140. The bracket 130 can be positioned adjacent to a mounting tab 126, so that the mounting tab 126 on one side of the support profile 108 is received between the lateral portions 148, with each lateral portion 148 extending along a corresponding side of the mounting tab 126. With the bracket 130 so positioned, the aperture 144 can align with the mounting slot 142 of the adjacent mounting tab 126, and the rotational axis B can extend through the aperture 144. Collectively, the aperture 144, the slots 142 of the opposing mounting tabs 126, and the cylindrical channel 140 can define a mounting passage. The bolt 128 can be aligned with the rotational axis B, and the shaft 136 can be inserted through the mounting passage, entering the mounting passage through aperture 144. Once inserted, the threaded portion 138 can extend through the mounting passage past the mounting tab 126 that is opposite to the mounting tab 126 adjacent to the bracket 130. The mounting nut 132 can be secured onto the threaded portion 138, securing the bolt 128 in place. In the illustrated embodiment, the roller 114 thus mounted, can rotate about the bolt 128 to reduce a friction between the panel 112 and the first support profile 108. The roller 114 can further include components for reducing a rotational friction, such as ball bearings or roller bearings, for example.

In some cases, it can be useful to provide structures for a mounting assembly to prevent rotation of a bolt and thus allow a nut to be fastened to the bolt without the need for a worker to apply a torque separately to the nut and the bolt to secure the nut to the bolt. As illustrated in FIG. 3B, when the bolt 128 is inserted through the mounting passage, surfaces of the hexagonal bolt head 134 can abut opposing walls 152 of the rectangular indent 150. The engagement of the surfaces of the hexagonal bolt head 134 and the walls 152 thus prevent rotation of the bolt relative to the bracket 130. The engagement between the lateral portions 148 and the sides of the mounting tab 126 can further prevent rotation of the bracket 130 relative to the mounting tab 126 and thus relative to the elongate mounting structure 116 as a whole. Hence, when the bolt 128 is inserted into the mounting passage, the bolt 128 is rotationally fixed relative to the elongate mounting structure 116 and a torque can be applied to the mounting nut 132 to secure it to the threaded portion 138 without a need to apply a separate torque to the hexagonal bolt head 134. Other configurations are possible, however, and a mounting assembly for a friction-reducing element can include other components and features for preventing the rotation of a bolt. Alternatively, a mounting assembly according to some embodiments could not have features for preventing rotation of a bolt.

In some embodiments, a friction-reducing element may be moved (e.g., translated vertically) between a first position corresponding to an installation configuration and a second position corresponding to an installed configuration. When the friction-reducing element is in the installation configuration, a support surface of the friction-reducing element can extend sufficiently into a channel of a support profile (e.g., vertically above a base wall of the support profile) to provide a surface which can engage a panel inserted into the channel. When the panel is positioned at a desired location within the channel, the friction-reducing elements can be removed from the channel (or otherwise shifted to extend into the channel by a smaller distance) so that a bottom surface of the panel can rest against and be directly supported by a base wall of the support profile.

Figure 4B:
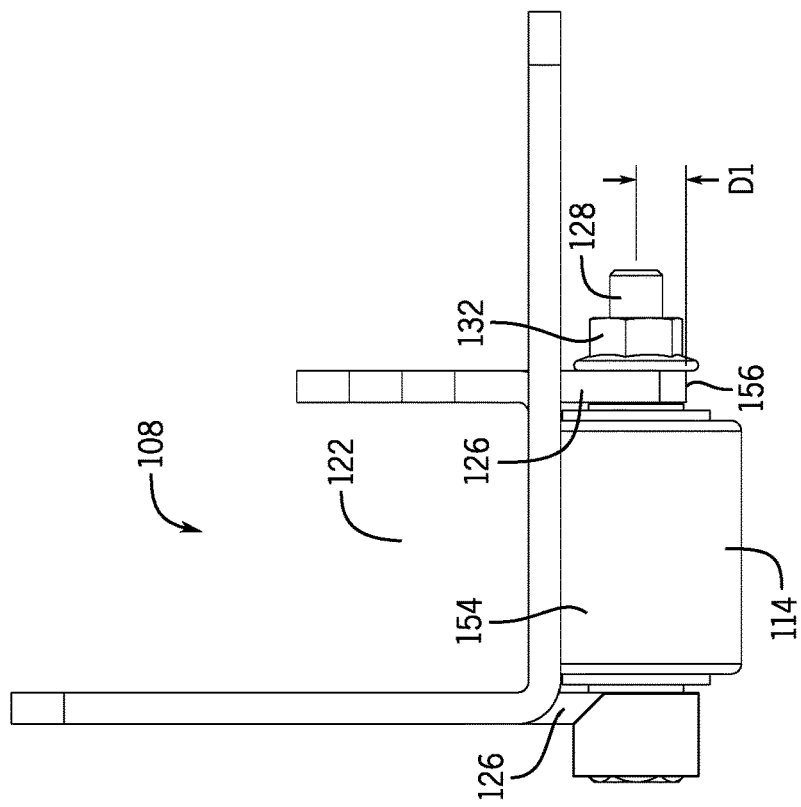
FIGS. 4A and 4B are front elevation views of the first support profile as shown in FIG. 1, with a roller shown in an installation and an installed configuration, respectively.
Figure 4A:
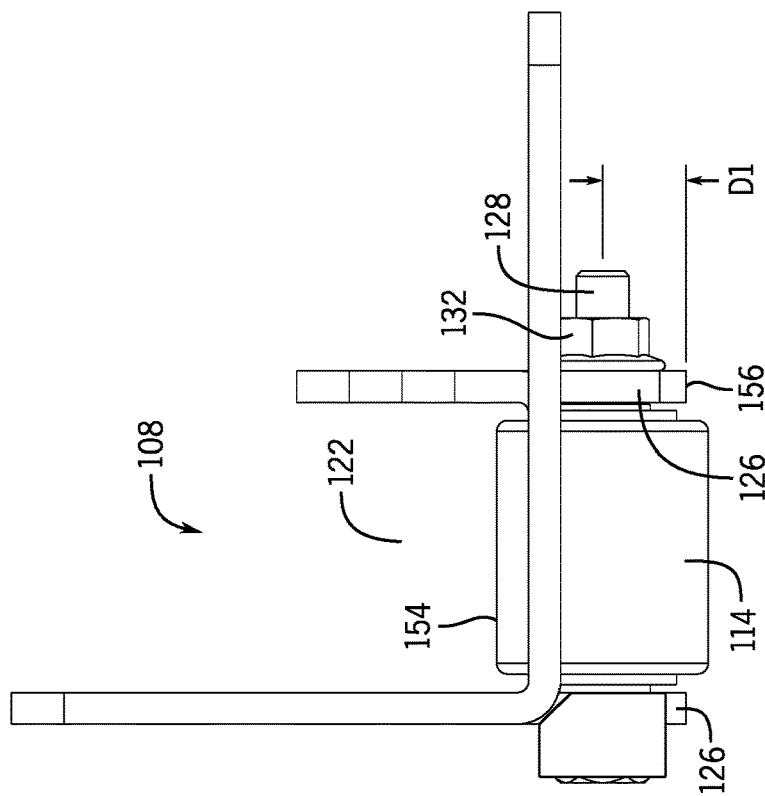

In this regard, then, FIGS. 4A and 4B illustrate one of the rollers 114 in an installation configuration and in an installed configuration respectively. As shown in FIG. 4A, in the installation configuration, a support surface 154 of the roller 114 can extend through a base aperture 124 (not shown) into the elongate channel 122. In this configuration, the bolt 128 can be secured at a first position within each of the slots 142 (see FIG. 3A) of the mounting tabs 126 adjacent to the base aperture 124 (e.g., at an upper end of the slots 142). With the bolt 128 so positioned, an axial center of the bolt 128 may be disposed at a first distance D1 above a bottom edge 156 of each of the mounting tabs 126, corresponding to the roller 114 extending sufficiently into the channel 122 to engage and support a panel.

As illustrated in FIG. 4B, in an installed configuration, the support surface 154 of the roller 114 does not extend into the elongate channel 122. Alternatively, in the installed configuration, a support surface of the friction-reducing element can extend above a base wall into an elongate channel by a distance that is less than a distance the support surface extends above the base wall in the installation configuration. In this configuration, as illustrated, the bolt 128 can be secured at a second location within the slots 142 (see FIG. 3A), and the axial center of the bolt 128 can be disposed at a second distance D2 above the bottom edge 156, the second distance D2 being smaller than the first distance D1.

Figure 5:
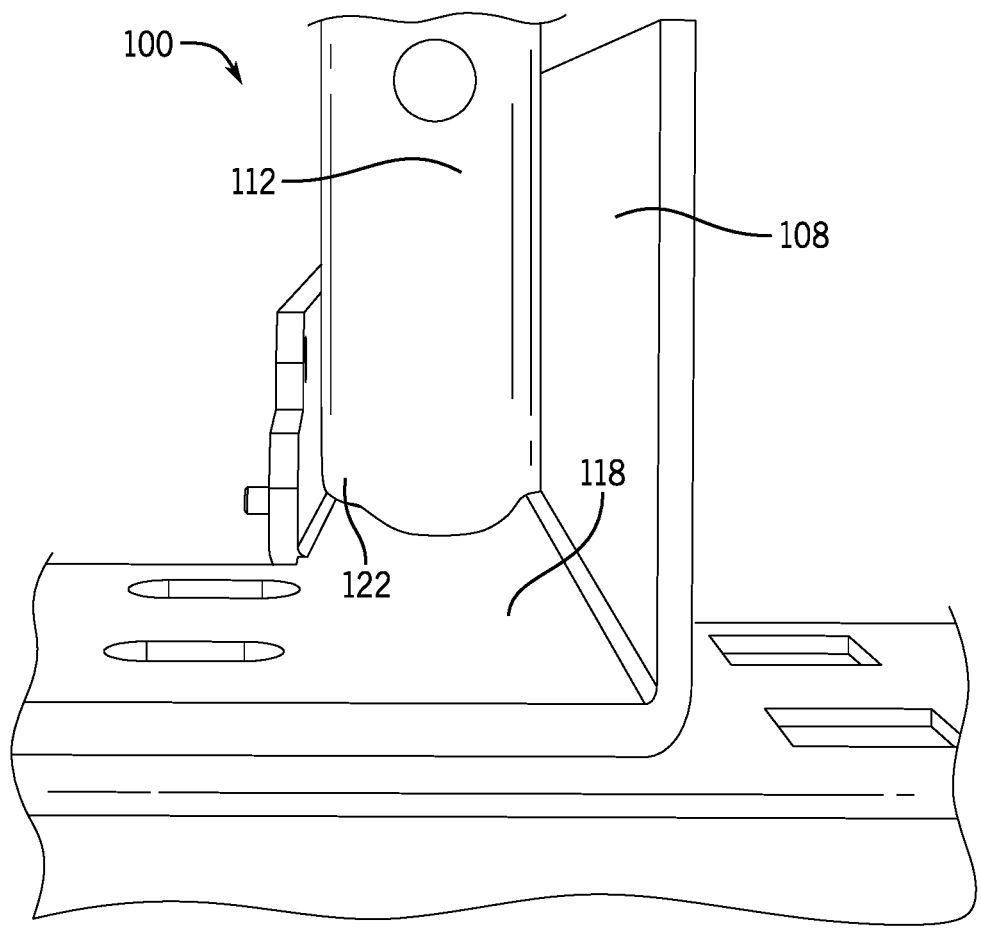
FIG. 5 is a rear elevation view of the first support profile mounted to a bottom frame member, with a panel shown in an installed position within an elongate channel of the first support profile.

To move the bolt 128 and therefore the roller 114 to the second position, a worker may loosen the mounting nut 132. Once loosened, gravity may urge the roller 114 vertically downward to the second position, or a weight of the panel 112 may urge the roller 114 downwardly to the second position, or the worker may manually move the roller 114 to the second position, into the installed configuration. As shown in FIG. 5, in the installed configuration, the panel 112 can rest against the base wall 118 of the first support profile 108, and so positioned, a friction between the base wall 118 and a bottom surface of the panel 112 can impede further translation of the panel 112 within the elongate channel 122. In other embodiments, a bolt may be moved by loosening an assembly through other means. For example, clamping mechanisms may be provided that can loosen the assembly through moving a clamp to a release position, rather than through applying a torque to a nut. Other embodiments are possible, however, and a mounting assembly may be loosened to allow a bolt to be moved through other mechanisms.

Figure 6:
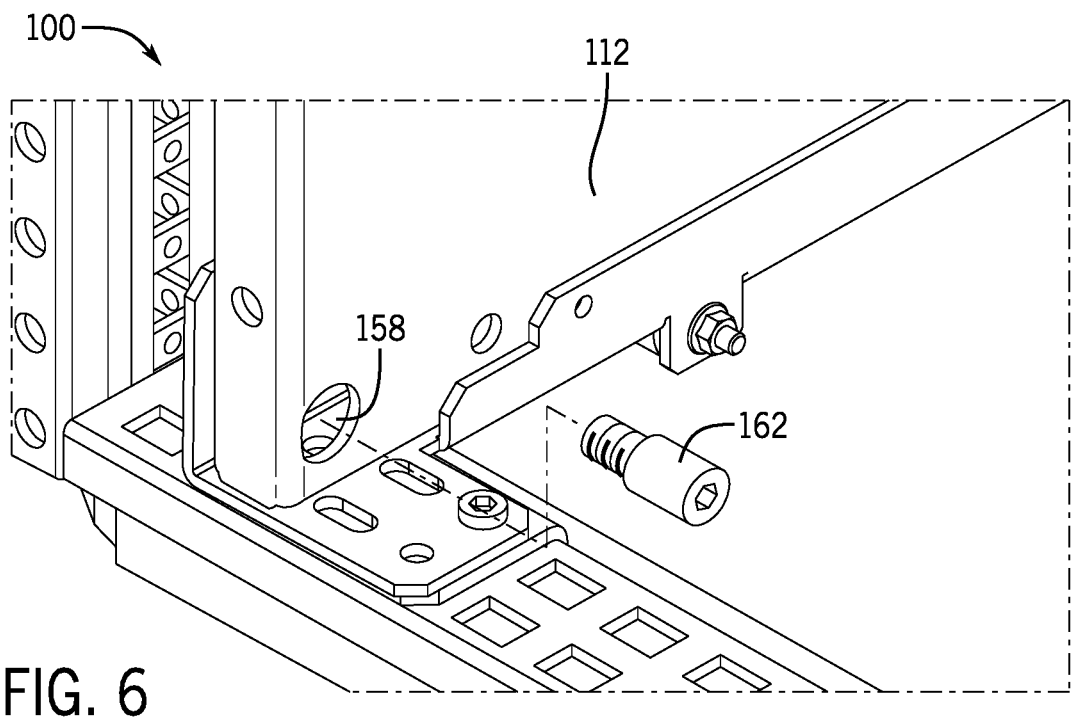
FIG. 6 is a partial front top right isometric view of the panel support system as shown in FIG. 1, further illustrating a fastener for securing the panel to the first support profile.

A panel support system can include additional features for securing a panel in the installed configuration to prevent translation of a panel relative to a support profile. For example, as shown in FIG. 6, the panel 112 can include a securing aperture 158 that can align with the threaded aperture 160 (see, e.g., threaded aperture 160 in FIG. 3B) provided in the sidewall 120a when the panel is in the installed position. A panel fastener 162 can extend through the securing aperture 158 and can be screwed into the threaded aperture 160 to secure the panel 112 against further translation.

Figure 7:
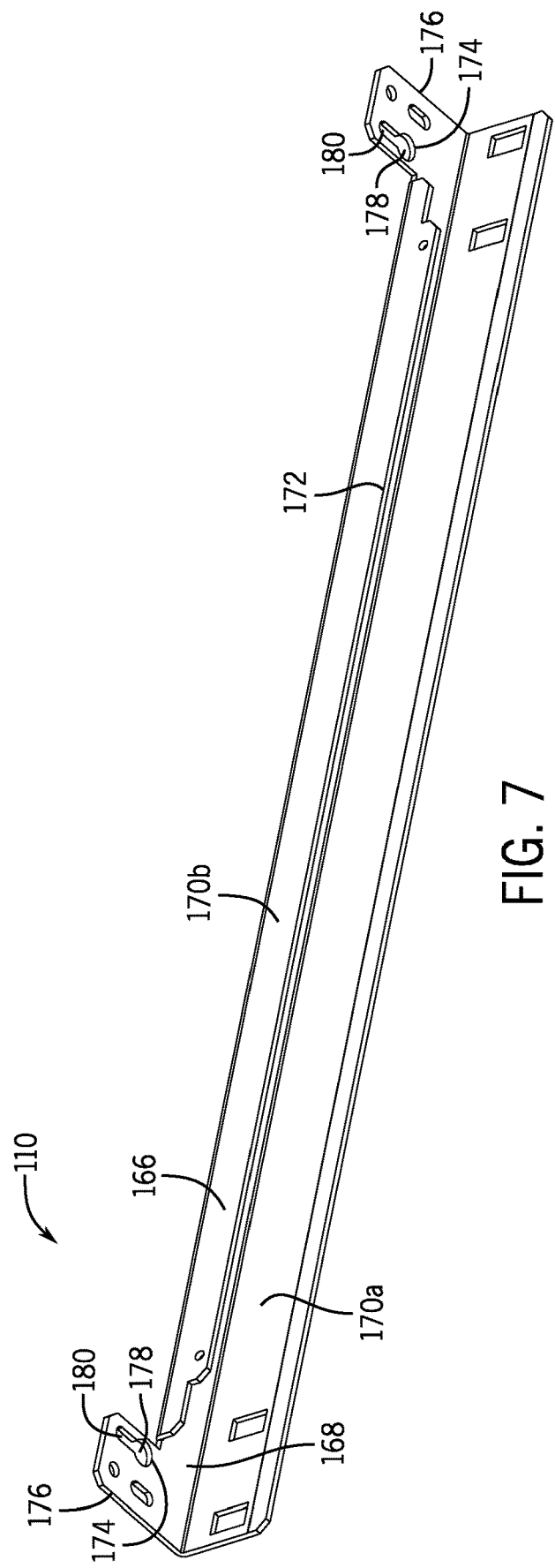
FIG. 7 is a front bottom right isometric view of a second panel support profile of the panel support system of FIG. 1.

When mounting a panel to an enclosure frame, it can be useful to secure a top of the frame as well as a bottom. In this regard, FIG. 7 further illustrates the second support profile 110, shown in FIG. 1. As shown in FIG. 7 the second panel support profile 110 can include an elongate channel structure 166 which can have a top wall 168, and opposing sidewalls 170a, 170b (e.g., as part of another integrally formed rail with a channel, as shown). The opposing sidewalls 170a, 170b can each be adjacent to and extend perpendicularly from the top wall 168 and can be parallel with the other opposing sidewall 170a, 170b. The opposing sidewalls 170a, 170b and the top wall 168 can each have a length in an elongate direction that is parallel to the insertion direction A of the panel. Further, as shown, the lengths of the sidewalls 170a, 170b may differ from the length of the other sidewall or from the length of the top wall 168. In other embodiments, however, opposing sidewalls of an elongate channel structure (e.g., a rail) of a support profile can have a length that is equal to a length of a top wall of the elongate channel structure. In the illustrated embodiment, the sidewalls 170a, 170b are integrally formed with the top wall 168, which may, for example, reduce material costs or assembly costs of the second support profile 110.

As further illustrated in FIG. 7, the sidewalls 170a, 170b and the top wall 168 of the elongate channel structure 166 may define a second elongate channel 172. The second elongate channel 172 as illustrated has an open side disposed opposite the top wall 168. A cross-sectional profile of the elongate channel 172 can be shaped and configured to receive a top edge of the panel 112. As an example, a cross-sectional profile of the second elongate channel 172 is generally rectangular, but an elongate channel can have a cross-sectional profile of any shape that is suitable for receiving a top edge of a panel.

The elongate channel structure 166 of the top support profile 110 can further include keyhole openings 174 on opposing ends of the elongate channel structure 166. As shown in FIG. 7, the keyhole openings 174 can be provided on mounting surfaces 176 which can extend from and be planar with the top wall 168. This embodiment can be particularly advantageous, as it can provide a location for mounting a second support profile to a top frame member of an enclosure frame, where a fastener extending through the keyhole opening does not extend into a second elongate channel, potentially impeding movement of panel within the elongate channel. In other embodiments, however, a top wall of a second, or top support profile can have openings for mounting the second support to a top frame member of an enclosure frame. The keyhole openings 174 can have a circular section 178, and a slotted section 180, the slotted section 180 having a width that is less than a diameter of the circular section 178.

Figure 8A:
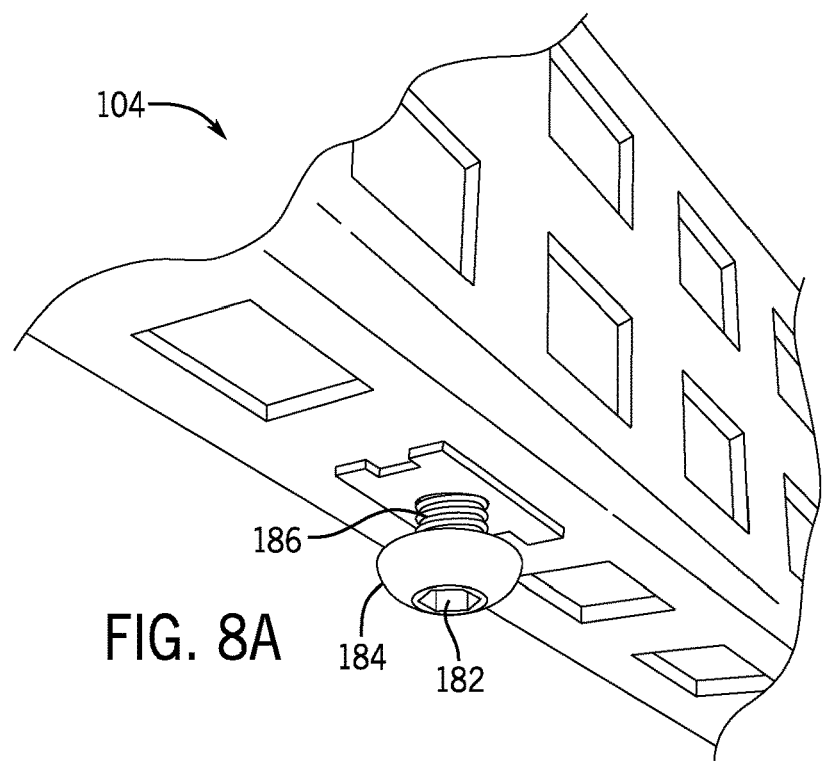
FIG. 8A is an isometric partial view of a top frame member of an enclosure frame, as shown in FIG. 1, with a screw protruding from the top frame member.
Figure 8B:
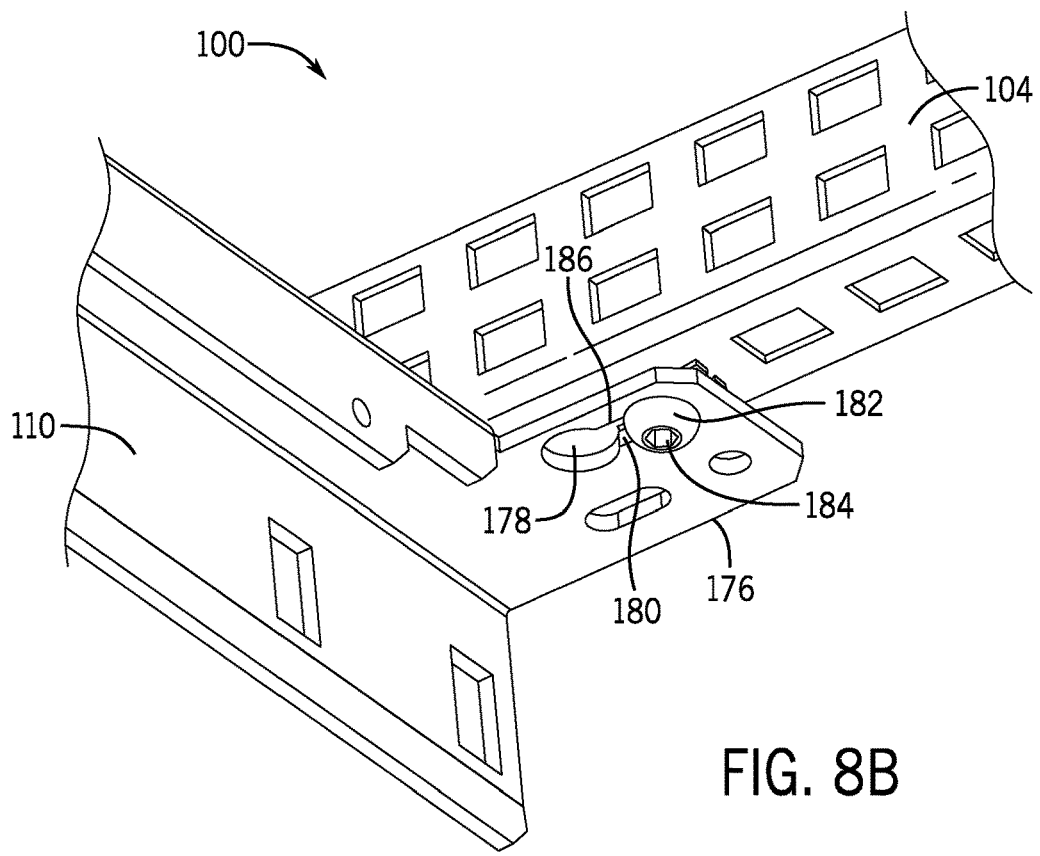
FIG. 8B is an isometric partial view of the panel support system shown in FIG. 1, showing the second panel support profile mounted to the top frame member.

As illustrated in FIG. 8A, a screw 182 can be provided on the top frame member 104 for mounting the second support profile 110 to the top frame member 104 and can protrude downwardly from the frame. The protruding screw 182 can include a screw head 184 with a diameter that is smaller than the diameter of the circular section 178, but greater than the width of the slotted section 180. The protruding screw can further include a screw shaft 186 with a diameter that is less than the width of the slotted section 180. While the illustrated embodiment illustrates one screw 182, multiple screws 182 can be provided along the top frame member 104, and a number and position of screws 182 can correspond to a number and spacing of keyhole openings 174 on the second support profile 110. To install the second support profile 110 to the top frame member 104, the circular section 178 of each of the keyhole openings 174 can be aligned with a corresponding screw 182. The second support profile 110 can then be moved upwardly toward the top frame member 104 so that, for each of the keyhole openings, the corresponding screw 182 is received through the circular section 178, and the screw head 184 extends downwardly past the mounting surface 176. The second support profile can then be urged laterally so that the screw shaft 186 extends through the slotted section 180, as shown in FIG. 8B.

With the frame member 104 so positioned, the screw head 184 engages the mounting surface 176 to secure the second support profile 110 against vertical displacement. The screw 182 can be then tightened to further secure the second support profile 110 in place. In some conventional panel support systems, a worker, or multiple workers may need to hold a top support profile in place, and, while holding the support profile, install a fastener through the top support profile to secure the profile in place. The described invention therefore provides a benefit over conventional systems by allowing a worker to place the support profile in place without needing to simultaneously install a fastener to secure the support profile in place.

As illustrated in FIGS. 9A and 9B, the first support profile 108 and the second support profile 110 can be aligned to collectively define a mounting channel structure 188 that provides (partial) rigid top, bottom, and lateral boundaries of a three-dimensional mounting envelope for receiving a panel 112 (not shown in FIGS. 9A and 9B). As illustrated, the first support profile 108 and the second support profile 110 can be positioned opposite each other with the second support profile 110 positioned vertically above the first support profile 108. The top wall 168 can thus be substantially parallel with and opposite the base wall 118. The sidewalls 120a, 120b can extend toward the second support profile 110, and sidewalls 170a, 170b can extend toward the first support profile, with sidewalls 120a and 170a being substantially coplanar, and sidewalls 120b and 170b being substantially coplanar. Thus, the elongate channel 122 opens toward, and is continuous with the elongate channel 172, the respective channels 122, 172 and the opening therebetween defining the mounting channel structure 188 for receiving the panel 112. Other configurations are possible, however, and a panel support system may include only one support profile, or support profiles of a panel support system may include fewer than two sidewalls, for example.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

What is claimed is:

1. A panel support system for mounting a panel to an enclosure, the panel support system comprising:
    an enclosure frame comprising a top frame member and a bottom frame member; and
    a support profile mounted to the bottom frame member to receive a panel in an insertion direction, the support profile including:
        a base wall that includes apertures along the insertion direction;
        cylinders secured to a channel structure in alignment with the apertures, with the cylinders movable relative to the base wall between an installation configuration and an installed configuration;
    in the installation configuration, the cylinders extending through the apertures to protrude a first height above the base wall, to rollingly support the panel for installation along the support profile; and
    in the installed configuration, the cylinders protruding above the base wall by less than the first height, to align the panel for support on the base wall.

2. The panel support system of claim 1, wherein the cylinders do not protrude above the base wall in the installed configuration.

3. The panel support system of claim 1, further comprising:
    downwardly depending tabs that extend from opposing lateral sides of the support profile to adjustably support the cylinders below the base wall.

4. The panel support system of claim 3, wherein the downwardly depending tabs include slots that support the cylinders for sliding movement between the installation and installed configurations.

5. The panel support system of claim 1, wherein the support profile includes lateral sidewalls that define an open channel profile to receive the panel.

6. The panel support system of claim 1, wherein, relative to movement of the panel, the material of the cylinders is configured to provide a lower coefficient of friction than the material of the base wall.

7. The panel support system of claim 1, further comprising:
a second support profile mounted to the top frame member, wherein the support profile and the second support profile collectively provide a mounting channel structure that is sized to receive the panel.

8. A panel support system to support a panel of an enclosure during and after installation of the panel, the panel support system comprising:
a panel support profile that includes:
a base wall extending along an elongate direction of the panel support profile;
a first mounting structure defining mounting slots at opposing lateral sides of the base wall; and
a first friction-reducing element adjustably secured to the first mounting structure at the mounting slots to be movable between:
an installation configuration, in which the first friction-reducing element protrudes above the base wall; and
an installed configuration in which the first friction-reducing element does not protrude above the base wall.

9. The panel support system of claim 8, wherein the panel support profile includes opposing lateral sidewalls disposed adjacent to the base wall to define an elongate U-shaped channel to receive the panel; and
wherein, in the installation configuration, the first friction-reducing element extends into the elongate channel.

10. The panel support system of claim 8, wherein the first friction-reducing element is a roller configured to rotate along an axis that extends between the mounting slots.

11. The panel support system of claim 8, wherein the base wall defines a first base aperture; and
wherein the first friction-reducing element is sized to be received into the first base aperture to move between the installed and installation configurations.

12. The panel support system of claim 8, further comprising:
a second friction-reducing element adjustably mounted to a second mounting structure along the panel support profile, the second friction-reducing element being spaced apart from the first friction-reducing element along the elongate direction of the base wall and being movable relative to the base wall between a second installation configuration and a second installed configuration.

13. The panel support system of claim 8, further comprising:
a first shaft that extends through the mounting slots and the first friction-reducing element; and
a mounting nut arranged to secure the first shaft relative to the panel support profile to secure the first friction-reducing element in the installation configuration.

14. The panel support system of claim 13, further comprising:
a bracket that non-rotatably secures the first shaft to the panel support profile.

15. The panel support system of claim 9, wherein the panel support profile is secured to an enclosure frame.

16. The panel support system of claim 15, wherein the panel support profile is positioned opposite a second panel support profile secured to the enclosure frame; and
wherein the panel support profile and the second panel support profile collectively define a mounting channel sized to receive a panel within the enclosure frame.

17. The panel support system of claim 8, wherein the first mounting structure includes tabs that extend from the panel support profile in a direction transverse to the base wall; and
wherein the mounting slots are defined in the tabs.

18. A method of installing a panel into an enclosure frame that includes a top frame member and a bottom frame member, the method comprising:
moving a panel along a support profile in an insertion direction, with the panel supported on friction-reducing elements of the support profile, the support profile being mounted to the bottom frame member and including a base wall that includes apertures along the insertion direction, and the panel being supported for movement in the insertion direction with the friction-reducing elements in an installation configuration, in which the friction-reducing elements extend a first height above the base wall; and
after moving the panel in the insertion direction, moving the friction-reducing elements to a second height above the base wall that is less than the first height, so that the panel is supported on the base wall.

19. The method of claim 18, further comprising:
before moving the panel in the insertion direction along the support profile, securing the friction-reducing elements in the installation configuration.

20. The method of claim 18, wherein the friction-reducing elements are cylinders that are rotatable about axes that are transverse to the insertion direction.

* * * * *